(12) United States Patent
Sumiyoshi et al.

(10) Patent No.: US 9,153,515 B2
(45) Date of Patent: Oct. 6, 2015

(54) METHOD FOR PRODUCING SEMICONDUCTOR ENCAPSULATING RESIN COMPOSITION AND PULVERIZING APPARATUS

(75) Inventors: Takafumi Sumiyoshi, Tokyo (JP); Hiroshi Shibata, Tokyo (JP)

(73) Assignee: SUMITOMO BAKELITE COMPANY LIMITED, Tokyo (JP)

( * ) Notice: Subject to any disclaimer, the term of this patent is extended or adjusted under 35 U.S.C. 154(b) by 263 days.

(21) Appl. No.: 13/636,610

(22) PCT Filed: Mar. 2, 2011

(86) PCT No.: PCT/JP2011/054696
§ 371 (c)(1),
(2), (4) Date: Sep. 21, 2012

(87) PCT Pub. No.: WO2011/122211
PCT Pub. Date: Oct. 6, 2011

(65) Prior Publication Data
US 2013/0012624 A1 Jan. 10, 2013

(30) Foreign Application Priority Data
Mar. 30, 2010 (JP) ................. 2010-079552

(51) Int. Cl.
C08J 3/12 (2006.01)
H01L 23/31 (2006.01)
B02C 19/06 (2006.01)
C08G 59/62 (2006.01)
C08L 63/00 (2006.01)
H01L 21/56 (2006.01)
C08K 3/00 (2006.01)

(52) U.S. Cl.
CPC .......... *H01L 23/3107* (2013.01); *B02C 19/061* (2013.01); *C08G 59/621* (2013.01); *C08J 3/12* (2013.01); *C08J 3/122* (2013.01); *C08L 63/00* (2013.01); *H01L 21/56* (2013.01); *C08J 2463/00* (2013.01); *C08K 3/0033* (2013.01); *H01L 2924/0002* (2013.01)

(58) Field of Classification Search
CPC ....... B02C 19/061; C08G 59/621; C08J 3/12; C08J 3/122; C08L 63/00; H01L 21/56
USPC .................... 241/39; 523/400, 461
See application file for complete search history.

(56) References Cited

U.S. PATENT DOCUMENTS

| 6,555,602 | B1 | 4/2003 | Harada et al. |
| 2006/0286269 | A1* | 12/2006 | Shah et al. ............ 426/618 |
| 2009/0186962 | A1 | 7/2009 | Kondo et al. |
| 2010/0255307 | A1 | 10/2010 | Gonze et al. |

FOREIGN PATENT DOCUMENTS

| JP | 11-246671 A | 9/1999 |
| JP | 2000-271929 | * 10/2000 |
| JP | 2000-271929 A | 10/2000 |
| JP | 2005-119197 A | 5/2005 |
| JP | 2005-281401 | * 10/2005 |
| JP | 2005-281401 A | 10/2005 |
| JP | 2006-187873 | * 7/2006 |
| JP | 2006-187873 A | 7/2006 |
| JP | 2006-297701 A | 11/2006 |
| JP | 3856425 B2 | 12/2006 |
| TW | 200911871 A | 3/2009 |
| WO | WO 2007/088889 A1 | 8/2007 |
| WO | WO 2009/016133 A1 | 2/2009 |

OTHER PUBLICATIONS

Notice of Refusal issued Jun. 24, 2014, in Japanese Patent Application No. 2010-079552, with English translation.
Changsen et al., "Technology and Apparatus of Powder," East China University of Science and Technology Press, Jan. 2007, 9 pages.
Chinese Office Action and Search Report, dated Jan. 12, 2015, issued in Chinese Application No. 201180013503.7.
Office Action issued Apr. 10, 2015, in Taiwan Patent Application No. 100108525.
International Search Report, dated Apr. 5, 2011, issued in PCT/JP2011/054696.

\* cited by examiner

*Primary Examiner* — Edward Cain
(74) *Attorney, Agent, or Firm* — Birch, Stewart, Kolasch & Birch, LLP

(57) ABSTRACT

A pulverizing apparatus is a gas stream type pulverizing apparatus. The pulverizing apparatus has a pulverizing unit for pulverizing a composition, a cooling device, a high-pressure air generating device and a collecting unit for receiving the pulverized composition. The chamber has a bottom portion, an outlet formed in the bottom portion for discharging the pulverized first composition therethrough and a wall portion formed in the bottom portion so as to surround the outlet. A plurality of first nozzles and a second nozzle are provided on a side portion of the chamber and a tubular supply unit is provided on an upper portion of the second nozzle. The gas pressure supplied into the chamber is 0.3 MPa or more, the gas temperature is 20° C. or less, and the humidity of the gas is 40% RH or less.

6 Claims, 4 Drawing Sheets

METHOD FOR PRODUCING SEMICONDUCTOR ENCAPSULATING RESIN COMPOSITION AND PULVERIZING APPARATUS

The present invention relates to a method for producing a semiconductor encapsulating (sealing) resin composition and a pulverizing apparatus for use in the method.

BACKGROUND OF THE INVENTION

There is known a semiconductor package in which a semiconductor chip (semiconductor element) is covered (encapsulated) with a resin-made encapsulating (sealing) material. The encapsulating material for the semiconductor chip is produced by molding a resin composition (pulverized resin composition) containing a curable resin through, e.g., a transfer molding method.

A process for producing the resin composition (pulverized resin composition) includes a pulverization process (fine pulverization process) of finely pulverizing a resin composition (a composition) containing plural kinds of powder materials (materials to be pulverized). For example, the pulverization process of the resin composition is performed by various pulverizing apparatuses including a vibratory ball mill, a continuous rotary ball mill or a gas stream type pulverizing apparatus such as a jet mill or the like (see, for example, patent document 1).

Among these pulverizing apparatuses, it is preferable to use the gas stream type pulverizing apparatus since it can prevent (or suppress) metallic foreign substances from being mixed into the resin composition during pulverization thereof.

However, the gas stream type pulverizing apparatus suffers from a problem in that the resin composition adheres to an inside of a chamber during pulverization. As a result, a yield is reduced. Another problem lies in that the resin composition absorbs moisture during pulverization, which leads to reduction of properties (e.g., curability) of the resin composition, and thereby the moldability thereof becomes poor.

Patent document 1: JP 3856425B

SUMMARY OF THE INVENTION

It is an object of the present invention to provide a method for producing a semiconductor encapsulating resin composition and a pulverizing apparatus for use in the method, which are capable of producing a semiconductor encapsulating resin composition having enhanced curability at a high yield while preventing metallic foreign substances from being mixed into the resin composition during pulverization.

In order to achieve the object, one aspect of the present invention is directed to a method for producing a semiconductor encapsulating resin composition, the method comprising:

pulverizing a composition containing a powder material of a curable resin and a powder material of an inorganic filler material by swirling the composition in a chamber with a swirl stream of a gas using a gas stream type pulverizing apparatus, wherein a pressure of the gas supplied into the chamber is equal to or more than 0.3 MPa, a temperature of the gas supplied into the chamber is equal to or less than 20° C., and a humidity of the gas supplied into the chamber is equal to or less than 40% RH.

In the method of the present invention, it is preferred that the composition includes a curing accelerator and the curable resin includes an epoxy resin and a phenolic resin-based curing agent.

In the method of the present invention, it is preferred that a content percentage of the inorganic filler material in the composition to be pulverized in the pulverizing process is in the range of 50 to 80 wt %.

In the method of the present invention, it is preferred that the method further comprises pre-mixing the composition prior to the pulverizing process.

In the method of the present invention, it is preferred that the swirl stream of the gas is generated by supplying the gas into the chamber and a flow rate of the gas supplied into the chamber is equal to or more than 1 Nm$^3$/min.

In the method of the present invention, it is preferred that an average value of an inner diameter of the chamber is in the range of 10 to 50 cm.

In the method of the present invention, it is preferred that particles of the composition thus pulverized in the pulverizing process have a particle size distribution which includes a first group having a particle size of 250 μm or more, a second group having a particle size of 150 μm or more but less than 250 μm, and a third group having a particle size of less than 150 μm, and wherein amounts of the first, second and third groups with respect to the amount of the whole of the pulverized composition are 1 wt % or less, 9 wt % or less and 90 wt % or more, respectively.

In order to achieve the object, another aspect of the present invention is directed to a gas stream type pulverizing apparatus for pulverizing a composition containing a powder material of a curable resin and a powder material of an inorganic filler material by swirling the composition with a swirl stream of a gas, the pulverizing apparatus comprising:

a chamber;

a supply device for supplying the composition into the chamber;

a swirl stream generating device for generating the swirl stream of the gas within the chamber;

a pressure adjusting device for adjusting a pressure of the gas supplied into the chamber;

a temperature adjusting device for adjusting a temperature of the gas supplied into the chamber; and a humidity adjusting device for adjusting a humidity of the gas supplied into the chamber, wherein the pressure of the gas supplied into the chamber is set equal to or more than 0.3 MPa, the temperature of the gas supplied into the chamber is set equal to or less than 20° C., the humidity of the gas supplied into the chamber is set equal to or less than 40% RH, and wherein the pulverizing apparatus is configured to pulverize the composition by generating the swirl stream of the gas within the chamber and swirling the composition with the swirl stream of the gas.

In the pulverizing apparatus of the present invention, it is preferred that the swirl stream generating device includes a plurality of nozzles which inject the gas into the chamber and are arranged along a circumferential direction of the chamber.

In the pulverizing apparatus of the present invention, it is preferred that the pressure adjusting device is a device for compressing the gas before the gas is supplied into the chamber.

In the pulverizing apparatus of the present invention, it is preferred that the temperature adjusting device is a device for cooling the gas before the gas is supplied into the chamber.

In the pulverizing apparatus of the present invention, it is preferred that the humidity adjusting device is a device for drying the gas before the gas is supplied into the chamber.

In the pulverizing apparatus of the present invention, it is preferred that the chamber includes a bottom portion, an outlet formed in the bottom portion for discharging the pulverized composition therethrough, and a wall portion formed in the bottom portion so as to surround the outlet, wherein the chamber is configured to allow the pulverized composition to go over the wall portion and then discharge the pulverized composition from the outlet.

In the pulverizing apparatus of the present invention, it is preferred that the supply device has a supply port for supplying the composition into the chamber.

In the pulverizing apparatus of the present invention, it is preferred that the supply port is provided out of alignment with a center of the swirl stream of the gas.

DETAILED DESCRIPTION OF THE PREFERRED EMBODIMENTS

Hereinbelow, a method for producing a semiconductor encapsulating (sealing) resin composition according to the present invention and a pulverizing apparatus for use in the method will be described in detail based on the preferred embodiments shown in the accompanying drawings.

Figure 1:
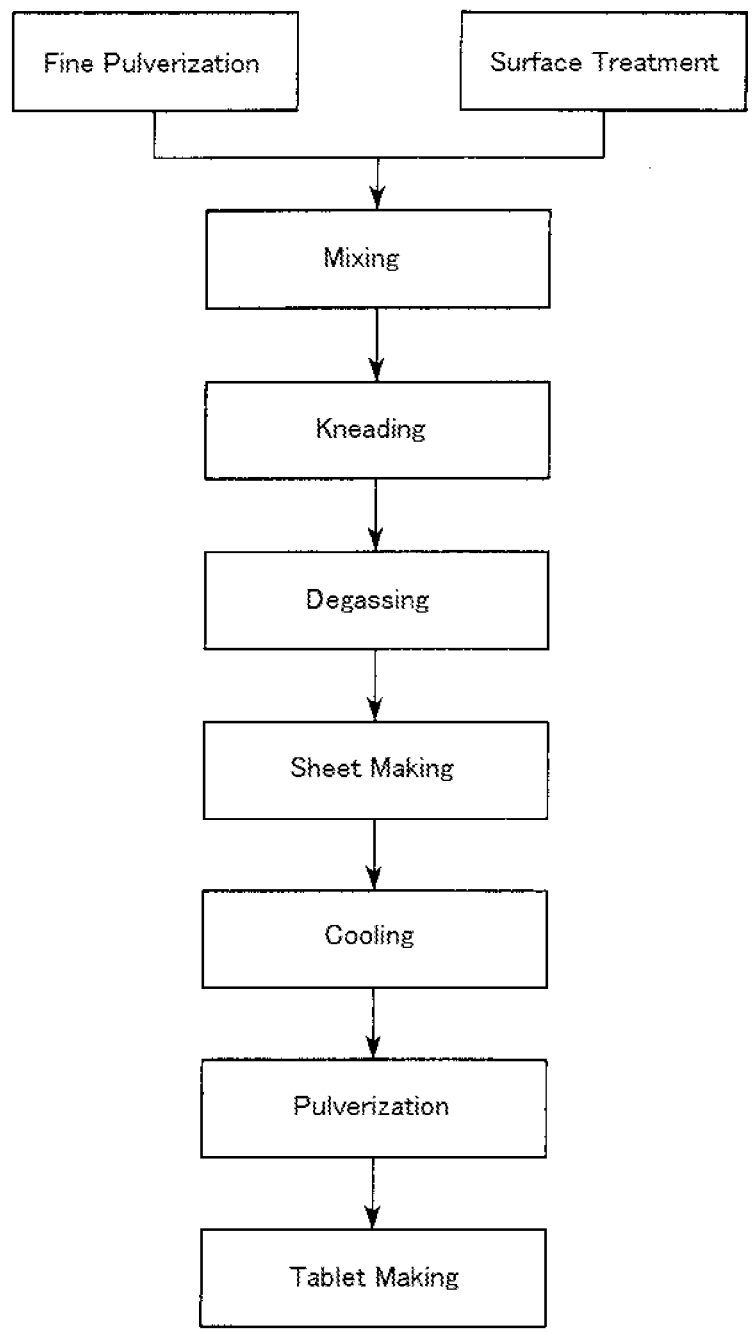
FIG. 1 is a process chart showing a producing process of a resin composition.
Figure 2:
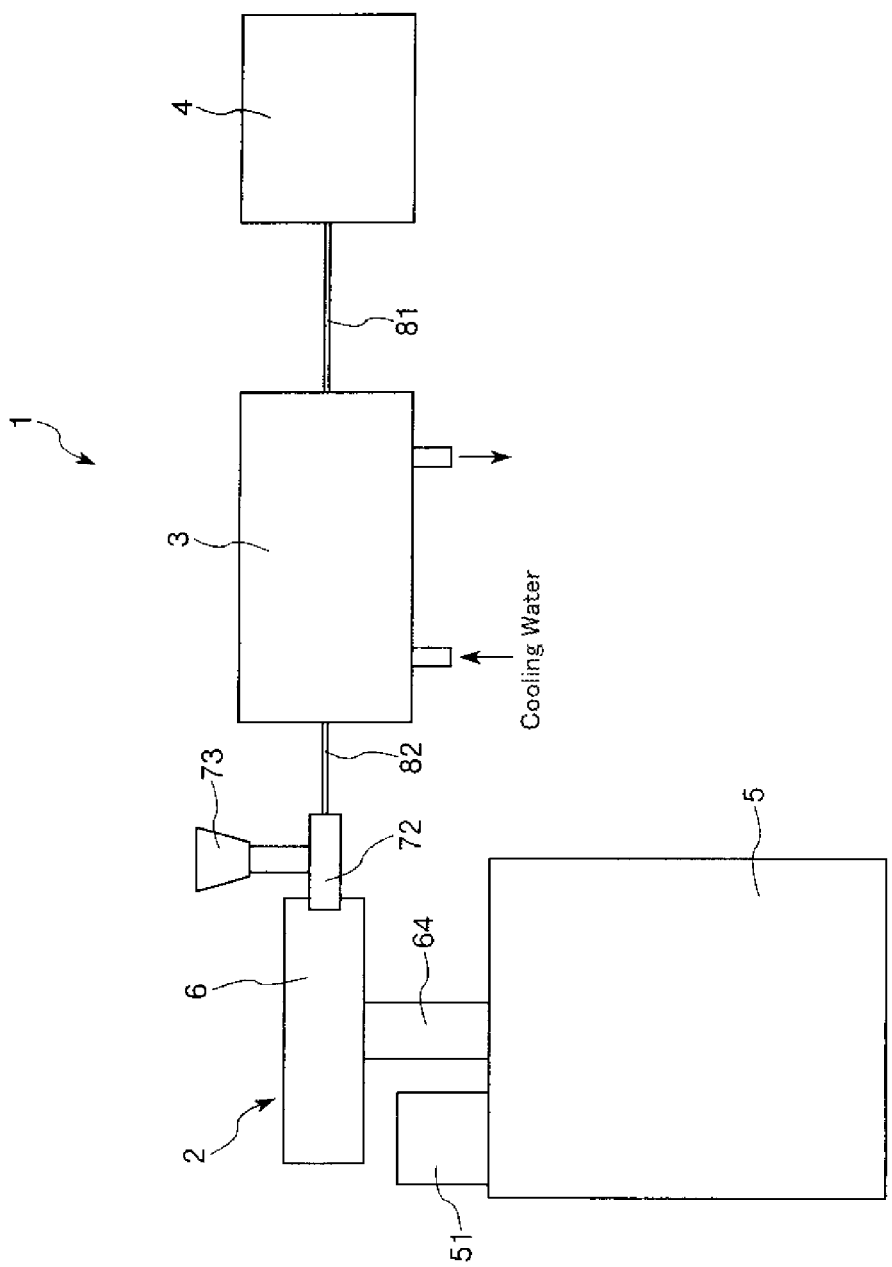
FIG. 2 is a side view schematically showing a pulverizing apparatus according to one embodiment of the present invention.
Figure 3:
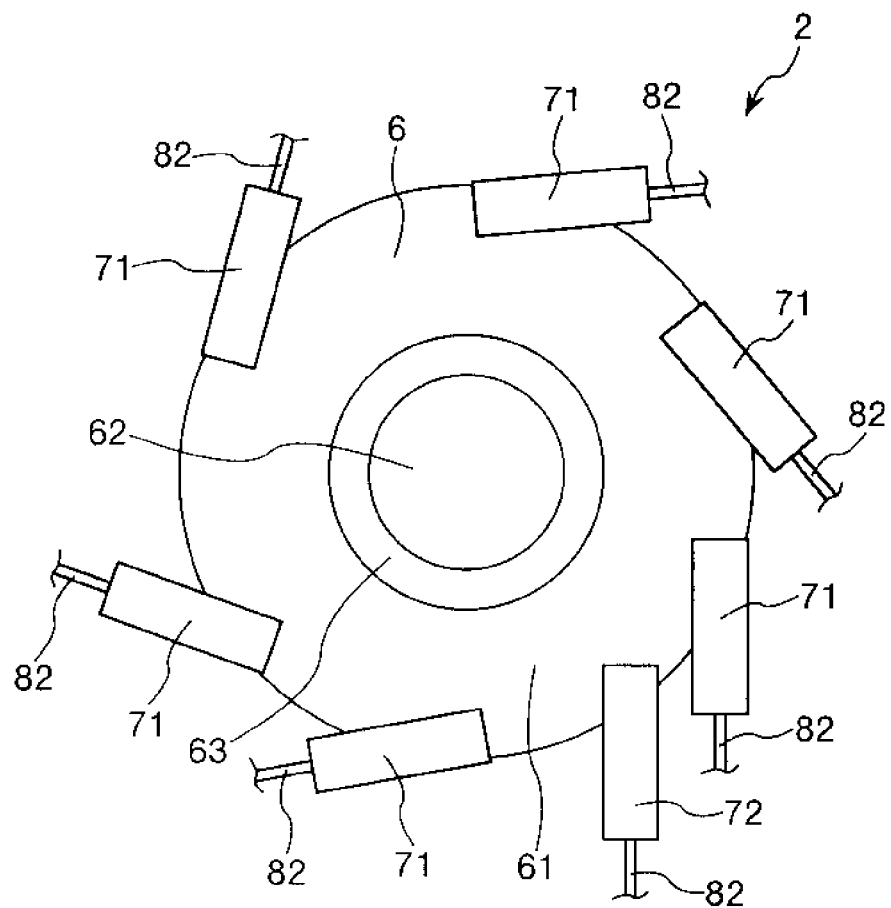
FIG. 3 is a top plan view schematically showing an inside of the pulverizing apparatus shown in FIG. 2.
Figure 4:
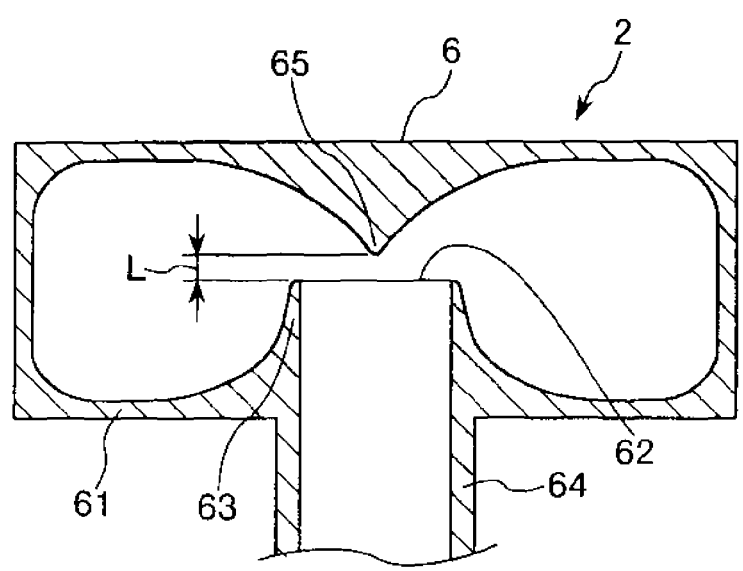
FIG. 4 is a sectional view showing a chamber of a pulverizing unit of the pulverizing apparatus shown in FIG. 2.

FIG. 1 is a process chart showing a producing process of a resin composition. FIG. 2 is a side view schematically showing a pulverizing apparatus according to one embodiment of the present invention. FIG. 3 is a top plan view schematically showing an inside of the pulverizing apparatus shown in FIG. 2. FIG. 4 is a sectional view showing a chamber of a pulverizing unit of the pulverizing apparatus shown in FIG. 2.

In the following description, the upper side of FIGS. 2 and 4 will be referred to as "upper", the lower side will be referred to as "lower", the left side will be referred to as "left" and the right side will be referred to as "right". In this regard, it should be noted that, only for the purpose of clarity, in FIG. 2 components such as nozzles 71 and the like are omitted, in FIG. 3 components such as a supply unit 73 and the like are omitted, and in FIG. 4 the nozzles 71, 72, the supply unit 73 and the like are omitted.

The (first) pulverizing apparatus 1 shown in FIG. 2 is a gas stream type pulverizing apparatus used in a fine pulverization process (pulverization process) to produce a resin composition as a molded body (compact). Prior to describing the pulverizing apparatus 1, description will be first given to the overall producing process which begins with the supply of raw materials and ends with the production of a semiconductor encapsulating resin composition for covering (encapsulating) a semiconductor chip (semiconductor element).

At first, individual materials as raw materials of a resin composition are prepared. The raw materials include a curable resin and a filler material (inorganic filler material, inorganic particles). If necessary, the raw materials may further include a curing accelerator and a coupling agent. Examples of the curable resin include an epoxy resin and so forth. In this case, it is particularly preferable to use an epoxy resin containing, as the curing agent, a phenolic-resin-based curing agent such as a phenol aralkyl type curing agent, a triphenol methane type curing agent or a multi-ring aromatic curing agent.

Examples of the epoxy resin include a cresol novolac type epoxy resin, a biphenyl type epoxy resin, a dicyclopentadiene type epoxy resin, a triphenol methane type epoxy resin, a multi-ring aromatic epoxy resin and so forth.

Examples of the phenolic resin include a phenol novolac type phenolic resin, a phenol aralkyl type phenolic resin, a triphenol methane type phenolic resin, a multi-ring aromatic phenolic resin and so forth. Examples of the filler material (inorganic filler material) include a fused silica (having a crushed shape or a spherical shape), a crystalline silica, an alumina and so forth.

Examples of the curing accelerator include a phosphor compound, an amine compound and so forth. Examples of the coupling agent include a silane compound and so forth.

Specific one or more of the materials stated above may be excluded from the raw materials. Other materials than set forth above may be further included in the raw materials. Examples of such other materials include a coloring agent, a releasing agent, a stress-reducing agent, a flame retardant and so forth.

Examples of the flame retardant include a borominated epoxy resin, an antimony oxide-based flame retardant, a non-halo- and non-antimony-based flame retardant and so forth. Examples of the non-halo- and non-antimony-based flame retardant include an organic phosphor, a metal hydrate, a nitrogen-containing resin and so forth.

(Fine Pulverization)

As shown in FIG. 1, specific materials among the raw materials are first pulverized (finely pulverized) by the pulverizing apparatus 1 to have a specified particle size distribution. Examples of the raw materials to be pulverized include the curable resin (which may contain the curing agent), the curing accelerator and other materials than the filler materials. A part of the filler material may be added in order to prevent the pulverized materials from adhering to a wall surface of the pulverizing apparatus 1. As a result, a first composition containing plural kinds of the pulverized materials such as the curable resin powder, the filler material powder, the curing accelerator powder and so forth is obtained. The pulverizing apparatus 1 will be described later.

(Surface Treatment)

A specified material among the raw materials, for example, a part of the filler material (the remainder of the filler material), is subjected to a surface treatment. In the surface treatment, the coupling agent is allowed to adhere to surfaces of the filler material (inorganic filler particles). As a result, a second composition containing powder materials of the filler material is obtained. The fine pulverization and the surface treatment may be performed either simultaneously or one after the other.

(Mixing)

Next, the first composition obtained in the fine pulverization process and the second composition obtained in the surface treatment process, namely, a resin composition (a composition) containing the plural kinds of pulverized materials is mixed thoroughly by a mixing device. Each of the pulverized materials contained in the resin composition has a different specific gravity. As the mixing device, it is possible to use a high-speed mixing device having rotary blades or the like.

(Kneading)

Next, the resin composition thus mixed is kneaded by a kneading device. As the kneading device, it is possible to use a kneading extruder such as a single-axis type kneading extruder or a double-axis type kneading extruder, or a roll type kneader such as a mixing roll and so forth.

(Degassing)

Next, the resin composition thus kneaded is degassed by a degassing device.

(Sheet Making)

Next, the resin composition thus degassed is molded into a sheet shape by a sheet-making device. As a result, a sheet shaped resin composition (sheet shaped resin material) is obtained. As the sheet-making device, it is possible to use, e.g., a sheet-making roll.

(Cooling)

Next, the sheet shaped resin composition is cooled by a cooling device. This makes it possible to easily and reliably perform pulverization of the sheet-shaped resin composition.

(Pulverization)

Next, the sheet-shaped resin composition is pulverized by a second pulverizing apparatus to have a specified particle size distribution. As a result, a pulverized resin composition is obtained. As the second pulverizing apparatus, it is possible to use, e.g., a hammer mill, a grindstone type mill, a roll crusher or the like.

The granular or pulverized resin composition may be obtained not by the way of the sheet-making, cooling and pulverizing processes but by, e.g., a hot cutting method in which a die having a small diameter is installed in an outlet port of a kneading extruder and then a molten resin composition discharged from the die is cut by a cutter into granular resin composition having a specified length. After obtaining the granular resin composition by the hot cutting method, it is preferable to perform degassing while the temperature of the resin compositions remains high.

(Tablet Making)

Next, the pulverized resin composition is compression-molded by a compact manufacturing device (tablet-making device) to obtain a resin composition in the form of compacts.

The resin composition is used in, e.g., covering (encapsulating) a semiconductor chip (semiconductor element). In other words, the resin composition is molded by, e.g., a transfer molding method and then the semiconductor chip is covered with the molded resin composition as a encapsulating material, thus manufacturing a semiconductor package.

The tablet-making process may be omitted and the pulverized resin composition may be used as final products. In this case, the pulverized resin composition is molded by, e.g., a compression-molding method or an injection-molding method to form a semiconductor encapsulating resin composition.

Next, description will be given to the pulverizing apparatus 1. As shown in FIGS. 2 through 4, the pulverizing apparatus 1 is a gas stream type pulverizing apparatus that uses a gas stream to pulverize the resin composition containing plural kinds of powder materials (materials to be pulverized). The pulverizing apparatus 1 includes a pulverizing unit 2 for pulverizing the first composition (resin composition), a cooling device 3, a high-pressure air generating device 4 and a collecting unit 5 for receiving the pulverized first composition.

The pulverizing unit 2 has a chamber 6 provided in the pulverizing unit 2. The chamber 6 has a cylindrical (tubular) portion and is configured to pulverize the first composition within the chamber 6. During the first composition being pulverized, a swirl stream of air (gas) is generated in the chamber 6.

A dimension of the chamber 6 is not particularly limited to a specific value, but an average value of an inner diameter of the chamber 6 is preferably in the range of about 10 to 50 cm, and more preferably in the range of about 15 to 30 cm. In the configuration shown in FIG. 4, the inner diameter of the chamber 6 is constant along a vertical direction of the chamber 6. Alternatively, the inner diameter of the chamber 6 may change along the vertical direction.

The chamber 6 has a bottom portion 61 and an outlet 62 formed in the bottom portion 61 for discharging the pulverized first composition therethrough. The outlet 62 is positioned in the central area of the bottom portion 61. While the shape of the outlet 62 is not particularly limited to a specific shape, the outlet 62 has a circular shape in the configuration shown in FIG. 4. A dimension of the outlet 62 is not particularly limited to a specific value, but is preferably in the range of about 3 to 30 cm, and more preferably in the range of about 7 to 15 cm.

A conduit line (pipe) 64 is provided in the bottom portion 61 of the chamber 6. One end portion of the conduit line 64 communicates with the outlet 62 and the other end portion of the conduit line 64 communicates with the collecting unit 5.

The chamber 6 further includes a wall portion 63 formed in the bottom portion 61 near the outlet 62. The wall portion 63 is formed so as to surround the outlet 62. The wall portion 63 can prevent the first composition from being unwillingly discharged from the outlet 62 during the first resin composition being pulverized.

The wall portion 63 has a tubular shape. In the configuration shown in FIG. 4, an inner diameter of the wall portion 63 is constant along the vertical direction thereof. An outer diameter of the wall portion 63 gradually increases from the upper side toward the lower side thereof. Namely, a height (vertical length) of the wall portion 63 gradually increases from an outer circumference of the chamber 6 toward an inner circumference of the chamber 6. As shown in FIG. 4, the wall portion 63 is curved into a concave shape in a side view. This makes it possible to smoothly deliver the pulverized first composition toward the outlet 62.

The chamber 6 further includes a top portion and a protrusion 65 formed on the top portion so as to correspond with the outlet 62 (or the conduit line 64). In the configuration shown in FIG. 4, a tip end portion (lower end portion) of the protrusion 65 is positioned higher than an upper end portion of the wall portion 63 (or the outlet 62). Alternatively, the tip end portion of the protrusion 65 may be positioned lower than the upper end portion of the wall portion 63 or may be positioned as high as the upper end portion of the wall portion 63.

Each of dimensions of the wall portion 63 and the protrusion 65 is not particularly limited to a specific value, but a length L between the upper end portion of the wall portion 63 (or the outlet 62) and the tip end portion (lower end portion) of the protrusion 65 is preferably in the range of about −10 to +10 μm, and more preferably in the range of about −5 to +1 μm.

The symbol "−" of the length L means that the tip end portion of the protrusion 65 is positioned lower than the upper end portion of the wall portion 63. The symbol "+" of the length L indicates that the tip end portion of the protrusion 65 is positioned higher than the upper end portion of the wall portion 63.

A plurality of nozzles (first nozzles) 71 are provided at a side portion (side surface) of the chamber 6. The first nozzles 71 inject air (gas) fed from the high-pressure air generating device 4 into the chamber 6. Each of the first nozzles 71 is arranged along the circumferential direction of the chamber 6. The intervals (angular intervals) between two adjoining first nozzles 71 may be either equal to or different from one another, but it is preferred that the intervals between the two adjoining first nozzles 71 are equal to each other. Each of the first nozzles 71 is installed in an inclined relationship with respect to the direction of a radius of the chamber 6 (a radius of the chamber 6 extending through a tip end of each of the first nozzles 71) in a top plan view. The number of the first nozzles 71 is not particularly limited to a specific value, but preferably in the range of about 5 to 8.

A major portion of a swirl stream generating device for generating a swirl stream of air (gas) within the chamber 6 is constituted of the first nozzles 71 and the high-pressure air generating device 4.

A nozzle (second nozzle) 72 is also provided on the side portion of the chamber 6. The second nozzle 72 injects (introduces) the first composition into the chamber 6 by the air fed from the high-pressure air generating device 4. Since the second nozzle 72 is provided on the side portion of the chamber 6, the first composition injected from the second nozzle 72 into the chamber 6 can instantly get on the swirl stream of air and begin to swirl.

A position of the second nozzle 72 on the side portion of the chamber 6 is not particularly limited to a specific position. In the configuration shown in FIG. 3, the second nozzle 72 is positioned between the two adjoining first nozzles 71. A vertical position of the second nozzle 72 may be either the same as or differ from a vertical position of each of the first nozzles 71, but it is preferred that the vertical position of the second nozzle 72 is the same as the vertical position of the first nozzles 71. The second nozzle 72 is installed in an inclined relationship with respect to the direction of a radius of the chamber 6 (a radius of the chamber 6 extending through the tip end of the second nozzle 72) in a top plan view.

For example, all the nozzles including the first nozzles 71 and the second nozzle 72 may be arranged at an equal interval (equal angular interval). In this case, the interval between the two first nozzles 71 adjoining to the second nozzle 72 is twice as great as the interval between the other two first nozzles 71 adjoining to each other. Alternatively, the first nozzles 71 may be arranged at an equal interval (equal angular interval) and the second nozzle 72 may be positioned in the middle position between the two adjoining first nozzles 71. This configuration in that the first nozzles 71 are arranged at the equal interval and the second nozzle 72 is positioned in the middle position between the two adjoining first nozzles 71 is desirable from the viewpoint of pulverizing efficiency.

A tubular supply unit (supply device) 73 is provided at an upper portion of the second nozzle 72. The tubular supply unit 73 communicates with the second nozzle 72 and supplies the first composition into the second nozzle 72. An upper end portion of the supply unit 73 is formed into a tapering shape having an inner diameter gradually increasing from a lower side toward an upper side thereof. An upper opening of the supply unit 73 serves as a supply port for the first composition and is provided out of alignment with the center of the swirl stream of air generated within the chamber 6 (thereby, the second nozzle 72 is provided out of alignment with the center of the swirl stream of the air). The first composition supplied from the supply unit 73 is fed into the chamber 6 through the second nozzle 72.

The collecting unit 5 includes an air vent portion 51 for discharging the air (gas) existing within the collecting unit 5 therethrough. In the configuration shown in FIG. 2, the air vent portion 51 is provided at an upper portion of the collecting unit 5. A filter that permits passage of the air (gas) but does not permit passage of the first composition is provided in the air vent portion 51. As the filter, it is possible to use a filtration cloth and so forth.

The high-pressure air generating device 4 is connected to the cooling device 3 through a first conduit line 81. The cooling device 3 is also connected to the first nozzles 71 and the second nozzle 72 of the pulverizing unit 2 through a second conduit line 82 which is branched into a plurality of lines in its midway.

The high-pressure air generating device 4 is a device for compressing air (gas) to feed a high-pressure air (compressed air) and is configured to adjust a flow rate and a pressure of the high-pressure air. The high-pressure air generating device 4 has a function of drying the high-pressure air and thereby reducing a humidity thereof. Namely, the high-pressure air generating device 4 is configured to adjust the humidity of the high-pressure air. Prior to being injected from the first nozzles 71 and the second nozzle 72 (supplied into the chamber 6), the high-pressure air is dried by the high-pressure air generating device 4. Accordingly, the high-pressure air generating device 4 has functions of a pressure adjusting device and a humidity adjusting device.

The cooling device 3 is a device for cooling the high-pressure air fed from the high-pressure air generating device 4 prior to the high-pressure air being injected from the first nozzles 71 and the second nozzle 72 (supplied into the chamber 6), and is configured to adjust a temperature of the high-pressure air. Accordingly, the cooling device 3 has a function of a temperature adjusting device. As the cooling device 3, it is possible to use a liquid coolant type cooling device, a gas coolant type cooling device or the like.

Next, description will be given to the fine pulverization process and the operation of the pulverizing apparatus 1 in the fine pulverization process.

(Fine Pulverization Process)

In the fine pulverization process (pulverization process), specific materials among the raw materials are pulverized (finely pulverized) by the pulverizing apparatus 1 to have a specified particle size distribution. Examples of the raw materials to be pulverized include the curable resin, the curing accelerator and other materials than the filler materials. In other words, the first composition containing plural kinds of powder materials (materials to be pulverized) such as the curable resin (which may contain the curing agent) and the curing accelerator is further finely pulverized to have a specified particle size distribution. In this regard, the first composition includes the filler material other than set forth above. Since a filler material having a fine particle size is commercially available, it is not necessary to finely pulverize the filler material in this fine pulverization process. By containing the filler material in the first composition, it is possible to prevent the first composition from adhering to an inner surface of the chamber during the first composition being pulverized by the pulverizing apparatus 1.

A content percentage of the filler material in the first composition is preferably in the range of about 50 to 80 wt %, and more preferably in the range of about 60 to 80 wt %. This makes it possible to make the first composition hard to adhere to the inner surface of the chamber 6.

Assuming that a weight of the filler material in the first composition is "a" and a weight of the filler material in the second composition obtained in the surface treatment process is "b", a/b is preferably in the range of about 0.4 to 1.5, and more preferably in the range of about 0.6 to 1.2.

The pressure of the air supplied into the chamber 6 is preferably set equal to or greater than 0.3 MPa, and more preferably in the range of about 0.5 to 0.8 MPa.

If the pressure of the air is less than the above lower limit value, the pulverizing ability becomes insufficient. This makes it impossible to finely pulverize the first composition and to have a target particle size distribution. As a result, it becomes difficult to uniformly disperse or mix the pulverized materials contained in the resin composition. If the air pressure is too high, there is a problem in that, depending on the structure of the air vent portion 51, an internal pressure of the collecting unit 5 gets increased. As a result, the pulverizing ability is lowered.

The flow rate of the air supplied into the chamber 6 is preferably set equal to or greater than 1 Nm$^3$/min (at 0° C. and 1 atm.), and more preferably in the range of about 3 to 5 Nm$^3$/min.

If the flow rate of the air is less than the above lower limit value, depending on the conditions such as an average value of the inner diameter of the chamber 6, the pulverizing ability becomes insufficient. This makes it impossible to finely pulverize the first composition and to have a target particle size distribution. As a result, it becomes difficult to uniformly disperse the powder materials contained in the resin composition. If the flow rate of the air is too high, there is a problem in that, depending on the structure of the air vent portion 51, the internal pressure of the collecting unit 5 gets increased. As a result, the pulverizing ability is lowered.

The temperature of the air supplied into the chamber 6 is preferably set equal to or less than 20° C., more preferably equal to or less than 15° C., and even more preferably in the range of about 0 to 5° C.

If the temperature of the air exceeds the above upper limit value, the first composition is likely to adhere to the inner surface of the chamber 6 during pulverization. As a result, the yield is reduced. If the temperature of the air is too low, reduction of properties of the resin composition is caused by dew condensation and moisture absorption.

The humidity of the air supplied into the chamber 6 is preferably set equal to or less than 40% RH, and more preferably in the range of about 0 to 15% RH.

If the humidity of the air exceeds the above upper limit value, the first composition absorbs moisture during pulverization. As a result, the properties, such as curability and so forth, of the resin composition are reduced and the moldability of the resin becomes poor.

The flow rate and the humidity of the swirl stream of the air can be adjusted (set) to target values by the high-pressure air generating device 4. The temperature of the air can be adjusted (set) to the target values by the cooling device 3.

At the time when the first composition is pulverized, the high-pressure air generating device 4 and the cooling device 3 are operated and the first composition is supplied from the supply unit 73.

The compressed high-pressure air (compressed air) is fed from the high-pressure air generating device 4 and is cooled by the cooling device 3. The high-pressure air is injected from the first nozzles 71 and the second nozzle 72 into the chamber 6. As a result, a swirl stream of the air is generated in the chamber 6.

The first composition is injected (introduced) into the chamber 6 from the second nozzle 72 by the high-pressure air fed from the high-pressure air generating device 4. Then, the first composition is swirled by the swirl stream of the air and the particles of the first composition are collided with one another and eventually pulverized. As the mass (diameter) of the particles gets decreased, the particles are delivered toward the central area of the chamber 6 and go over the wall portion 63. Then, the particles are discharged from the outlet 62, sent to the collecting unit 5 through the conduit line 64 and received in the collecting unit 5.

The air flowing into the collecting unit 5 is discharged to the outside from the air vent portion 51. Therefore, it is not necessary for the pulverizing apparatus 1 to have a cyclone type air separation device. By omitting such a cyclone type air separation device, it is possible to increase the yield of the resin composition finally produced.

The first composition is finely pulverized through the pulverization process and then also classified according to the particle size thereof. In this case, it is preferred that particles of the composition thus pulverized in the pulverizing process have a particle size distribution which includes a first group having a particle size of 250 μm or more, a second group having a particle size of 150 μm or more but less than 250 μm, and a third group having a particle size of less than 150 μm, wherein amounts of the first, second and third groups with respect to the amount of the whole of the pulverized composition are 1 wt % or less, 9 wt % or less and 90 wt % or more, respectively. It is more preferred that amounts of the first, second and third groups with respect to the amount of the whole of the pulverized composition are 0.5 wt % or less, 4 wt % or less and 95 wt % or more, respectively. This makes it possible to uniformly disperse the pulverized materials of the resin composition in an easy and reliable manner during the subsequent mixing process.

In this regard, it is to be noted that it is preferred that the first composition is pre-mixed by a mixing device prior to the fine pulverization process. As the mixing device, it is possible to use a high-speed mixing device having rotary blades, a drum mixer or the like.

As described above, the pulverizing apparatus 1 is a gas stream type pulverizing apparatus. This makes it possible to prevent (or suppress) metallic foreign substances from being mixed into the resin composition during the fine pulverization process and to prevent short circuit when a semiconductor chip is encapsulated by the resin composition finally produced.

In particular, by setting the temperature of the air supplied into the chamber 6 to a predetermined value, it is possible to prevent the first composition from adhering to the inside of the chamber 6 during pulverization and to increase the yield of the resin composition finally produced.

By setting the humidity of the air supplied into the chamber 6 to a predetermined value, it is possible to prevent reduction of properties (e.g., curability) of the first composition caused by moisture absorption of the first composition. This makes it possible to enhance the moldability of the resin composition finally produced.

By setting the pressure of the air supplied into the chamber 6 to a predetermined value, it is possible to relatively finely pulverize the first composition. This makes it possible to uniformly disperse the pulverized materials of the resin composition in an easy and reliable manner during the subsequent mixing process.

While the descriptions have been made for the method for producing the semiconductor encapsulating resin composition of the present invention and the pulverizing apparatus for use in the method based on the illustrated embodiments, the present invention is not limited thereto. Each component constituting the pulverizing apparatus and each process constituting the method may be substituted for an arbitrary component or process having the same function as it. In addition, other arbitrary components or processes may be added to the present invention.

EXAMPLES

Next, description will be given to specific examples of the present invention.

<Raw Materials>
<Raw Materials of the First Composition>
Raw materials of the first composition used include:

7.9 parts by weight of biphenyl type epoxy resin (YX4000H produced by Yuka Shell Epoxy Co., Ltd., which has a melting point of 105° C. and an epoxy equivalent of 195);

6.6 parts by weight of phenol aralkyl resin (XLC-3L produced by Mitsui Chemicals, Inc., which has a melt viscosity of 2.0 poises at 150° C. and a hydroxyl equivalent of 172);

1.0 parts by weight of borominated phenol novolac type epoxy resin (having a softening point of 85° C. and an epoxy equivalent of 280);

0.2 parts by weight of 1,8-diazabicyclo(5,4,0)undecene-7;

21.0 parts by weight of fused silica (inorganic particles);

0.5 parts by weight of carnauba wax; and 0.3 parts by weight of carbon black.

<Raw Materials of the Second Composition>
Raw materials of the second composition used include:

63.0 parts by weight of fused silica (having an average particle size of 16 μm); and 0.5 parts by weight of epoxy silane coupling agent.

Example 1

[1] Production of First Composition

The mixed resin composition (first composition) was pulverized using the pulverizing apparatus 1 shown in FIG. 2 under the following conditions:

the pressure of the air supplied into the chamber being 0.7 MPa;

the temperature of the air supplied into the chamber being 3° C.; and the humidity of the air supplied into the chamber being 9% RH.

[2] Production of Second Composition

The second composition was obtained by allowing the epoxy silane coupling agent to adhere to the surfaces of the fused silica using a ribbon blender.

[3] Production of Semiconductor-Encapsulating (Sealing) Resin Composition

Next, the first composition and the second composition were mixed by a Henschel mixer and then melted and kneaded by a double-axis type kneading extruder. Then, the first composition and the second composition were degassed, cooled, and pulverized by a pulverizing machine. As a result, a semiconductor encapsulating resin composition was obtained.

Example 2

A resin composition was obtained in the same manner as Example 1, except that the production conditions of the first composition were changed to:

the pressure of the air supplied into the chamber being 0.4 MPa;

the temperature of the air supplied into the chamber being 3° C.; and the humidity of the air supplied into the chamber being 9% RH.

Example 3

A resin composition was obtained in the same manner as Example 1, except that the production conditions of the first composition were changed to:

the pressure of the air supplied into the chamber being 0.7 MPa;

the temperature of the air supplied into the chamber being 17° C.; and the humidity of the air supplied into the chamber being 9% RH.

Example 4

A resin composition was obtained in the same manner as Example 1, except that the production conditions of the first composition were changed to:

the pressure of the air supplied into the chamber being 0.7 MPa;

the temperature of the air supplied into the chamber being 3° C.; and the humidity of the air supplied into the chamber being 24% RH.

Example 5

A resin composition was obtained in the same manner as Example 1, except that the production conditions of the first composition were changed to:

the pressure of the air supplied into the chamber being 0.4 MPa;

the temperature of the air supplied into the chamber being 17° C.; and the humidity of the air supplied into the chamber being 24% RH.

Comparative Example 1

A resin composition was obtained in the same manner as Example 1, except that the production conditions of the first composition were changed to:

the pressure of the air supplied into the chamber being 0.2 MPa;

the temperature of the air supplied into the chamber being 3° C.; and the humidity of the air supplied into the chamber being 9% RH.

Comparative Example 2

A resin composition was obtained in the same manner as Example 1, except that the production conditions of the first composition were changed to:

the pressure of the air supplied into the chamber being 0.7 MPa;

the temperature of the air supplied into the chamber being 25° C.; and the humidity of the air supplied into the chamber being 9% RH.

Comparative Example 3

A resin composition was obtained in the same manner as Example 1, except that the production conditions of the first composition were changed to:

the pressure of the air supplied into the chamber being 0.7 MPa;

the temperature of the air supplied into the chamber being 3° C.; and the humidity of the air supplied into the chamber being 45% RH.

Comparative Example 4

A resin composition was obtained in the same manner as Example 1, except that the production conditions of the first composition were changed to:

the pressure of the air supplied into the chamber being 0.2 MPa;

the temperature of the air supplied into the chamber being 25° C.; and the humidity of the air supplied into the chamber being 45% RH.

[Evaluation]

The resin compositions obtained in Examples 1 through 5 and in Comparative Examples 1 through 4 were evaluated in the following manner. The results of evaluation are shown in Table 1.

(Particle Size Distribution)

The particle size distribution of the first composition was measured using a measuring instrument (Powder Tester manufactured by Hosokawa Micron Corporation) under the following conditions: an amplitude of 1 mm; the number of frequency of 3,000 VPM; a measuring time of 60 seconds; two kinds of sieves having apertures of 250 μm and 150 μm; and a sample weight of 6 g per time.

(Yield)

The yield was calculated by measuring the weight of the first composition before and after the first composition was pulverized by the pulverizing apparatus.

(Curability)

The semiconductor encapsulating resin composition was placed on a heating platen and kneaded with a spatula from the complete melting time to the complete curing time. The time (gelling time) taken from the complete melting time to the complete curing time was used as an index indicating curability.

TABLE 1

| | Supplied Air | | | Particle size distribution | | | | |
| --- | --- | --- | --- | --- | --- | --- | --- | --- |
| | Pressure (MPa) | Temperature (° C.) | Humidity (% RH) | no less than 250 μm | no less than 150 μm and less than 250 μm | less than 150 μm | Yield (%) | Gelling time (sec) |
| Example 1 | 0.7 | 3 | 9 | 0.0 | 2.0 | 98.0 | 99 | 35 |
| Example 2 | 0.4 | 3 | 9 | 0.7 | 7.0 | 92.3 | 99 | 35 |
| Example 3 | 0.7 | 17 | 9 | 0.1 | 2.1 | 97.8 | 97 | 35 |
| Example 4 | 0.7 | 3 | 24 | 0.0 | 2.1 | 97.9 | 98 | 37 |
| Example 5 | 0.4 | 17 | 24 | 0.7 | 7.5 | 91.8 | 97 | 37 |
| Comparative example 1 | 0.2 | 3 | 9 | 2.5 | 23.0 | 74.5 | 99 | 35 |
| Comparative example 2 | 0.7 | 25 | 9 | 0.3 | 2.7 | 97.0 | 88 | 36 |
| Comparative example 3 | 0.7 | 3 | 45 | 0.1 | 2.4 | 97.5 | 97 | 45 |
| Comparative example 4 | 0.2 | 25 | 45 | 3.0 | 25.0 | 72.0 | 86 | 45 |

As it is apparent from Table 1, the particle size distribution, the yield and the curability are all satisfactory in Examples 1 through 5.

In contrast, the particle size distribution is poor in Comparative Example 1, the yield is poor in Comparative Example 2 and the curability is poor in Comparative Example 3. The particle size distribution, the yield and the curability are all poor in Comparative Example 4.

INDUSTRIAL APPLICABILITY

With the present invention, the composition is pulverized using the gas stream type pulverizing apparatus. This makes it possible to prevent metallic foreign substances from being mixed into the composition during fine pulverization and to prevent short circuit when a semiconductor chip is encapsulated (sealed) by the resin composition finally produced.

In particular, since the temperature of the air supplied into the chamber is set equal to a predetermined value, it is possible to prevent the composition from adhering to the inside of the chamber during pulverization and to increase the yield of the resin composition finally produced.

Further, by setting the humidity of the gas in the chamber at a predetermined value, it is possible to prevent reduction of properties (e.g., curability) of the composition which may otherwise be caused by moisture absorption of the first composition. This makes it possible to enhance the moldability of the resin composition finally produced.

Further, by setting the flow rate of the gas supplied into the chamber at a predetermined value, it is possible to relatively finely pulverize the composition. This makes it possible to uniformly disperse or mix the pulverized materials of the resin composition in an easy and reliable manner during the subsequent mixing process. For these reasons stated above, the present invention is industrially applicable.

What is claimed is:

1. A method for producing a semiconductor encapsulating resin composition, comprising:

pulverizing a composition containing a powder material of a curable resin and a powder material of an inorganic filler material by swirling the composition in a chamber with a swirl stream of a gas using a gas stream type pulverizing apparatus, wherein a pressure of the gas supplied into the chamber is equal to or more than 0.3 MPa, a temperature of the gas supplied into the chamber is equal to or less than 20° C., and a humidity of the gas supplied into the chamber is equal to or less than 40% RH, wherein particles of the composition thus pulverized in the pulverizing process have a particle size distribution which includes a first group having a particle size of 250 μm or more, a second group having a particle size of 150 μm or more but less than 250 μm, and a third group having a particle size of less than 150 μm, and wherein amounts of the first, second and third groups with respect to the amount of the whole of the pulverized composition are 1 wt % or less, 9 wt % or less, and 90 wt % or more, respectively.

2. The method as claimed in claim 1, wherein the composition includes a curing accelerator and the curable resin includes an epoxy resin and a phenolic resin-based curing agent.

3. The method as claimed in claim 1, wherein a content percentage of the inorganic filler material in the composition to be pulverized in the pulverizing process is in the range of 50 to 80 wt %.

4. The method as claimed in claim 1, wherein further comprising pre-mixing the composition prior to the pulverizing process.

5. The method as claimed in claim 1, wherein the swirl stream of the gas is generated by supplying the gas into the chamber and a flow rate of the gas supplied into the chamber is equal to or more than 1 $Nm^3$/min.

6. The method as claimed in claim 1, wherein an average value of an inner diameter of the chamber is in the range of 10 to 50 cm.

\* \* \* \* \*